(12) United States Patent
Wolf

(10) Patent No.: US 12,176,890 B2
(45) Date of Patent: Dec. 24, 2024

(54) CIRCUIT ARRANGEMENT FOR CURRENT LIMITING AND ELECTRICAL SYSTEM

(71) Applicant: Robert Bosch GmbH, Stuttgart (DE)

(72) Inventor: Mathis Wolf, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 101 days.

(21) Appl. No.: 18/313,663

(22) Filed: May 8, 2023

(65) Prior Publication Data

US 2023/0370062 A1    Nov. 16, 2023

(30) Foreign Application Priority Data

May 11, 2022    (DE) ...................... 10 2022 204 586.6

(51) Int. Cl.
*H03K 17/60*    (2006.01)
*H03K 17/0412*    (2006.01)
*H03K 17/082*    (2006.01)

(52) U.S. Cl.
CPC ....... *H03K 17/60* (2013.01); *H03K 17/04126* (2013.01); *H03K 17/0822* (2013.01)

(58) Field of Classification Search
CPC .................................................... H03K 17/60
USPC ......................................................... 327/478
See application file for complete search history.

(56) References Cited

U.S. PATENT DOCUMENTS 6,304,472 B1 * 10/2001 Nagasu ................. H02M 7/003
363/131

FOREIGN PATENT DOCUMENTS

| DE | 10355964 A1 | 6/2005 |
| DE | 102017123644 A1 | 4/2018 |
| DE | 102019202163 A1 | 8/2020 |
| WO | 2010051836 A1 | 5/2010 |

* cited by examiner

*Primary Examiner* — Tomi Skibinski
(74) *Attorney, Agent, or Firm* — Michael Best & Friedrich LLP

(57) ABSTRACT

A circuit arrangement and an electrical system, where in the circuit arrangement, an output terminal of a current limiting control circuit is connected to a control input of a semiconductor switch via a resistor (RG), and a gate driver is connected to the control input of the semiconductor switch via the gate resistor RG and to the resistor (R). The current limiting control circuit is configured to change its output impedance at the output terminal in order to control the semiconductor switch. A source terminal of the semiconductor switch is connected to a reference potential (GND) of the circuit arrangement, and the semiconductor switch is configured so as to set a current (I) in a circuit between an electrical power source and a load. A first inductor (L1) and a second inductor (L2) are connected in series within the circuit.

10 Claims, 1 Drawing Sheet

CIRCUIT ARRANGEMENT FOR CURRENT LIMITING AND ELECTRICAL SYSTEM

BACKGROUND

The present invention relates to a circuit arrangement for current limiting and an electrical system comprising such a circuit arrangement.

Electrical systems, such as drive trains of battery-electrically powered vehicles, in which error states, in particular low-impedance short circuits, are determined and in which suitable measures are implemented to limit and/or prevent damage to components of the electrical systems in the event of an error, are known from the prior art.

In battery-electrically powered vehicles in particular, it is important to prevent an electrical short circuit, for example in a circuit between a traction battery and an inverter, in the millisecond range. The traditional approach here is to monitor a voltage across a shunt by means of an electronic measuring system in order to activate a pyrotechnic battery disconnect system (pyrofuse) when a specific voltage is exceeded, so that a circuit having the short circuit is interrupted.

DE 102019202163 A1 describes a device and a method for shutting down a battery cell in a battery system of a vehicle in the event of an electrical short circuit. A measurement element is used to produce a measurement voltage based on an amperage gradient. The short circuit is detected via an analog circuit connected to the measurement element, wherein the analog circuit activates a switch to interrupt the current flow.

SUMMARY

According to a first aspect of the present invention, a circuit arrangement for current limiting is proposed, which can advantageously be used in a battery-electrically powered vehicle, for example to protect a traction battery and/or other components, in particular a drive train of a vehicle, from damage in the event of the occurrence of an overcurrent.

It should be noted that the circuit arrangement according to the invention is not limited to such an area of application and can in principle be used advantageously in any electrical system. It should also be noted that a current limiting realized by the circuit arrangement according to the invention advantageously ensures a limiting of a current to a predefined value or range of values deviating from 0 A, but that a complete current limiting to a value of 0 A or approximately 0 A is explicitly also possible.

The current limiting circuit arrangement comprises a first inductor, a second inductor, a current limiting control circuit, a resistor, a capacitor, a semiconductor switch, a gate driver, and a gate resistor.

An output terminal of the current limiting control circuit is connected to a control input (generally a gate terminal) of the semiconductor switch via the resistor.

Furthermore, the gate driver is connected via the gate resistor to the control input of the semiconductor switch and to the resistor and is configured so as to control the semiconductor switch to open and close. The opening and closing explicitly also comprises possible control states between a full closing and a full opening of the semiconductor switch, i.e., different "control levels" of the semiconductor switch. The gate resistor and the limiting resistor accordingly form a voltage divider, which is set as a function of the output impedance of the current limiting control circuit.

The current limiting control circuit is configured to change an output impedance of the current limiting control circuit at the output terminal in order to control the semiconductor switch.

A source terminal of the semiconductor switch is connected to a reference potential of the circuit arrangement (e.g., a ground potential or a potential deviating therefrom), and the semiconductor switch is configured so as to adjust a current in a circuit from an electrical power source (hereinafter also briefly referred to as a "power source") and a load (hereinafter briefly referred to as a "load") as a function of control by the current limiting control circuit.

For this purpose, a load path of the semiconductor switch (usually a channel between a source and a drain terminal of the semiconductor switch) is connected in series between the power source and the load. It should be noted that the semiconductor switch can be arranged in a branch between the power source and the load that has the higher potential of the two branches between the power source and the load as well as in the branch that has the lower potential.

The first inductor and the second inductor are connected in series within the circuit, wherein the first inductor and/or the second inductor can be arranged in the branch with the higher potential and/or in the branch with the lower potential in the circuit between the power source and the load. Furthermore, it is possible that the first inductor is formed at least proportionally by an inductor of the electrical power source and/or that the second inductor is formed at least proportionally by an inductor of the load.

A first input terminal of the current limiting control circuit is connected via the capacitor to a node between the first inductor and the second inductor, and a second input terminal of the current limiting control circuit is connected to the reference potential.

Based on this configuration, the current limiting control circuit is configured so as to detect an overcurrent-related reloading of the capacitor and in response reduce its output impedance in order to thus increase an output impedance of the semiconductor switch on the basis of a voltage drop across the resistor, so that the increased output impedance in the semiconductor switch counteracts the overcurrent.

The overcurrent-related reloading of the capacitor can in particular be caused by a low-impedance short circuit in the circuit, which leads to respective voltage drops over the first inductor and the second inductor. Alternatively or additionally, the reloading can also more generally be caused by a current gradient in the circuit that exceeds a predefined current gradient for the circuit. The circuit arrangement according to the invention can be designed in such a way that an occurring short circuit is counteracted by the circuit arrangement at a very early stage at which a current gradient characteristic of the short circuit is reached, for example, as a result of which especially quick short circuit countermeasures can be implemented.

In addition to the especially quick detection and quick handling of an overcurrent (because, for example, short circuits with a very high current increase can be detected and limited even at very low currents), the circuit arrangement according to the invention provides, among other things, the advantages that components within the circuit in which the circuit arrangement is being used can be reliably protected from damage by an overcurrent.

It also provides the advantage that, by suitably defining electrical parameters of the circuit arrangement, a power supply of the load and/or other loads in the circuit can be resumed automatically as soon as the overcurrent-related current gradient subsides. Such a case is conceivable, for example, if the overcurrent is caused by a time-limited interference pulse coupled into the circuit and/or by similar temporarily occurring events. This makes it possible to increase the availability of components of the circuit, which can be advantageous in particular when the circuit arrangement according to the invention is used in connection with a monitoring of a drive train of a battery-electrically powered vehicle.

It should further be noted generally that the circuit arrangement according to the invention, and in particular the current limiting control circuit, can advantageously additionally comprise a protective circuit and/or a filter circuit, for example to filter coupled short interference pulses, so that they do not affect the circuit in a current limiting manner, thereby improving an availability of the circuit arrangement.

The current limiting circuit is also particularly advantageous as an analog circuit and in particular as a passive analog circuit, because this enables an especially quick reaction of the circuit arrangement according to the invention to an existing overcurrent.

In an advantageous embodiment of the present invention, the semiconductor switch is a power semiconductor switch, alternatively or additionally a MOSFET, an IGBT, or a JFET, and further alternatively or additionally a Si, a SiC, or a GaN-based semiconductor switch. It is also possible that the semiconductor switch is a topological semiconductor switch formed of a plurality (e.g., two, three, four or more) of parallel-connected individual semiconductor switches. The latter can be used advantageously in particular when high currents are to be switched and/or reduced by means of the semiconductor switch.

The first inductor and/or the second inductor is preferably a parasitic inductor and/or a discrete component and/or a coil and/or a transformer. Alternatively or additionally, they are an inductor of a shunt element and/or a drain source channel of a semiconductor switch, in particular of the semiconductor switch of the circuit arrangement and/or a line of the circuit and/or a busbar and/or a conductor track of a printed circuit board. In particular in the case in which the first inductor and/or the second inductor is a parasitic inductor of an already existing component of the circuit, an especially cost-efficient and simple implementation of the circuit arrangement according to the invention can be achieved. The parasitic inductor of a shunt element can be defined precisely by the geometric dimensions of the shunt element, for instance. It is also possible to set a suitable value for the inductor required according to the invention in a flexible manner by means of one or more additionally added taps on an existing component of the circuit (e.g., on said shunt element).

The circuit arrangement is advantageously configured to permanently maintain the overcurrent-related increased output impedance of the semiconductor switch (e.g., on the basis of a latch circuit), so that a reduction of the reloading flow across the capacitor after an overcurrent-related current gradient does not lead to a full restart of the semiconductor switch, even though the cause of the overcurrent (e.g., a short circuit) is still present. Alternatively, it is possible to return the increased output impedance to an original value prior to the occurrence of the overcurrent after a predefined period of time when the voltage drop across the first inductor and the second inductor is reduced. Among other things, this provides the advantage that briefly occurring overcurrents, which are caused by coupled interference pulses, for example, do not lead to a permanent reduction in the output impedance of the semiconductor switch. The predefined time period is advantageously defined as a function of an expected duration of potentially occurring interference pulses and/or some other type of overcurrent-causing events.

In a further advantageous embodiment of the present invention, the circuit arrangement is configured to completely inhibit a current flow through the semiconductor switch when an overcurrent-related reloading of the capacitator is detected. This is accomplished, for example, by a shutdown circuit whose input is connected in parallel to the first input terminal and the second input terminal of the current limiting control circuit and whose output is directly connected to the control input of the semiconductor switch, so that the control input of the semiconductor switch is pulled in the direction of the source potential or preferably to the source potential of the semiconductor switch. A parallel circuit of such a shutdown provides the advantage that, in the case of an existing overcurrent, by means of the current limiting control circuit, a current reduction in the circuit to a predefined value greater than 0 A can first occur, and, at a later time, a complete interruption of the circuit can occur downstream (e.g., after a predefined delay time) through the shutdown. Among other things, this can result in the circuit not having to be completely interrupted in case of time-limited current gradients. Alternatively, or in addition to the shutdown, it is also possible to reduce the resistor R to a minimum resistance value, which is formed, for example, only by the resistance of a connecting line between the output terminal of the current limiting control circuit and the control input of the semiconductor switch.

In a further advantageous configuration of the present invention, the limiting resistor is a linear and/or a non-linear limiting resistor and in particular a Zener diode. The use of a Zener diode has the advantage that the voltage divider consisting of the gate resistor and the limiting resistor does not have to be defined as a function of the specific configuration of the circuit arrangement, because the substantially constant voltage drop across the Zener diode (e.g., 6 V) is instead decisive for the control of the control input of the semiconductor switch. The current limiting control circuit is preferably configured on the basis of a bipolar transistor and/or on the basis of a MOSFET, the output impedance of which is adjusted in the event of an overcurrent by controlling a control input of the bipolar transistor or the MOSFET.

Particularly advantageously, the circuit arrangement comprises a discharging resistor connected to a first terminal having a base terminal of the bipolar transistor and connected to a second terminal having a node between the resistor and the control input of the semiconductor switch. Accordingly, the discharging resistor determines how quickly the base of the bipolar transistor is drawn back up to the gate potential, i.e., how long the current limiting state remains active. Alternatively or additionally, the circuit arrangement comprises a damping resistor, which is connected between the capacitor and the first input terminal. Depending on the capacitor and damping resistor, a sensitivity and inertia of the current limiting control circuit can be adjusted. The bipolar transistor only controls continuously for as long as a sufficiently high reloading current flows through the base of the bipolar transistor.

Advantageously, the capacitor is a parasitic capacitor, whereby the costs of a standalone component are saved. The parasitic capacitor can be, for example, conductor track condensers or capacitators deviating therefrom. In particular in the case of a combination of the circuit arrangement according to the invention with a latch circuit for maintaining a state of a current limiting, the use of parasitic capacitators is suitable, because in this case a particularly low capacity (e.g., a few picofarad) is sufficient.

The electrical power source is a battery, for example, and in particular a drive battery for an electrically drivable vehicle. The battery is configured to provide a voltage in the range of 48 V to 1000 V and preferably between 200 V and 800 V, for example, without thereby creating a restriction to said voltage ranges. Preferably, the load is an inverter for a drive train of a vehicle and/or an A/C compressor and/or an electric heater and/or an on-board charger, etc. The use of the circuit arrangement according to the invention is moreover particularly advantageous when the load is connected in parallel with an intermediate circuit capacitor, by means of which an especially high current gradient is produced in the event of a short circuit in the load and/or in another part of the circuit, because an inductor of the battery in the event of a short circuit does not initially have a current-limiting effect.

According to a second aspect of the present invention, an electrical system is proposed, which comprises a circuit arrangement as described above, an electrical power source (e.g., a battery), a load (e.g., an inverter in connection with an electric motor), and a vehicle electrical system for a vehicle. The vehicle is a car, a truck, a bus, a rail vehicle or a two-wheeled vehicle, for instance. Among other things, the vehicle electrical system is configured to transmit electrical power from the electrical power source to the load. The circuit arrangement is configured to reduce a current between the load and the electrical power source by means of a control of the semiconductor switch if a current flowing through the vehicle electrical system corresponds to an overcurrent.

BRIEF DESCRIPTION OF THE DRAWINGS

Embodiment examples of the invention are described in detail below with reference to the accompanying drawings. The figures show.

DETAILED DESCRIPTION

Figure 1:
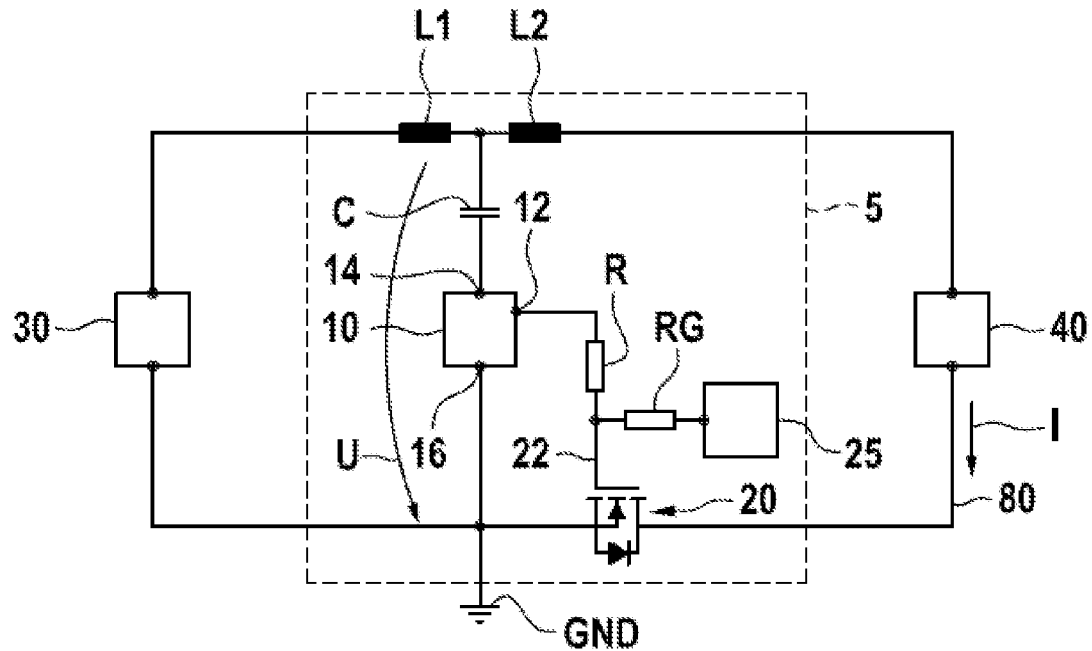
FIG. 1 a circuit diagram of an electrical system according to the invention comprising a circuit arrangement according to the invention for current limiting according to a preferred embodiment.

FIG. 1 shows a circuit diagram of an electrical system according to the invention comprising a circuit arrangement 5 according to the invention according to a first embodiment. The electrical system here is an electrical system of a drive train of a battery-electrically powered vehicle.

In addition to the circuit arrangement 5 for current limiting, the electrical system comprises an electrical power source configured as a battery 30 of a drive train of the vehicle, a load configured as an inverter 40 of the drive train, and a vehicle electrical system 80 of the vehicle, which together form a circuit.

The circuit arrangement 5 has a first inductor L1 and a second inductor L2 which are, for example, inductors of an electrical conductor of the vehicle electrical system 80. Alternatively or additionally, the inductors L1, L2 can be formed by coils and/or transformers and/or by inductors of the battery 30 and the inverter 40 and/or by any other inductive components.

An output terminal 12 of a current limiting control circuit 10 of the circuit arrangement 5 is connected via a resistor R to a gate terminal 22 of a MOSFET 20, which is a SiC MOSFET 20 here. A source terminal of the semiconductor switch 20 is connected to a reference potential GND of the circuit arrangement 5.

The MOSFET 20 is configured so as to adjust a current I within the circuit as a function of a control by the current limiting control circuit 10.

It should be noted that MOSFET 20 can be composed of a plurality of parallel-switched MOSFETs 20, for example, when high currents are to be limited or switched by means of the MOSFET 20.

In a normal operation, in which no short circuit and no critical current gradient is present within the circuit, the MOSFET 20 is therefore controlled only by a gate driver 25 of the circuit arrangement 5 via a gate resistor RG.

A first input terminal 14 of the current limiting control circuit 10 is connected via the capacitor C to a node between the first inductor L1 and the second inductor L2, while a second input terminal 16 of the current limiting control circuit 10 is connected to the reference potential GND.

Based on this configuration, the current limiting control circuit 10 is configured to detect a short circuit-related reloading of the capacitor C and in response reduce its output impedance in order to thus increase an output impedance of the MOSFET 20 on the basis of a voltage drop across the resistor R, so that the increased output impedance in the MOSFET 20 counteracts the overcurrent.

As a function of a ratio of the respective amounts of the inductors L1, L2, a voltage U is set in a short circuit event between the node which connects the inductors L1, L2 and the capacitor C and the reference potential GND due to the short circuit-related voltage drops across the inductors L1, L2, which voltage U is less than a supply voltage UBAT of the battery 30, wherein the supply voltage of the battery 30 here corresponds to a value of 800 V. If further resistors and inductors are neglected within the circuit, the following voltage U=UBAT*L2/(L2+L1) thus results. For example, if the two inductors L1, L2 are equal, the voltage U will be halved accordingly. The resulting voltage gradient dU/dt is used in the current limiting control circuit 10 for the short circuit detection.

Advantageously, the circuit arrangement 5 according to the invention is combined with a latch circuit (not shown), which is configured so as to permanently maintain a current limiting state of the MOSFET 20 in order to protect the components of the electrical system.

In addition, it is advantageously possible to form the capacitor C by means of conduction capacitors of the circuit arrangement 5 according to the invention in order to save costs.

Figure 2:
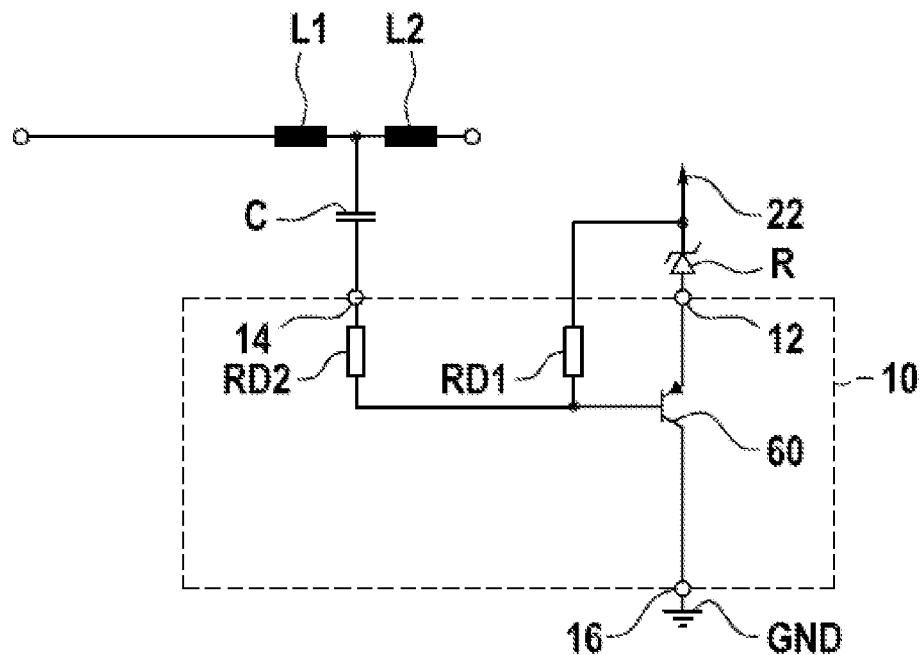
FIG. 2 a circuit diagram of a current limiting control circuit of a circuit arrangement according to the invention according to a further preferred embodiment.

FIG. 2 shows a circuit diagram of a current limiting control circuit 10 of a circuit arrangement 5 according to the invention according to a further preferred embodiment.

For ease of understanding, in addition to the current limiting control circuit 10, some components (L1, L2, C, R) of the superordinate circuit arrangement 5 are shown, which, in order to avoid repetitions, are only described where they differ from FIG. 1.

The resistor R of the circuit arrangement 5 is configured here as a non-linear resistor in the form of a Zener diode, which produces a substantially constant voltage drop in the amount of 6 V in case of a current flow through the Zener diode. This voltage drop is used in order to control the MOSFET 20 of FIG. 1 to increase an output impedance of the MOSFET 20 in a short circuit event.

The reduction of the output impedance of the current limiting control circuit 10 according to the present invention at a present high current gradient (e.g., due to a short circuit) in the circuit shown in FIG. 1 occurs here through a bipolar transistor 60.

It should be noted that the current limiting control circuit 10, in an altered design, can also be configured by means of a MOSFET and/or a transistor deviating therefrom.

The current limiting control circuit 10 also comprises a decharging resistor RD1, which determines how quickly the base of the bipolar transistor 60 is drawn back up to the gate potential after a detected short circuit, i.e., how long a current limiting state remains active.

In addition, the circuit arrangement comprises a damping resistor RD2 via which, in conjunction with the capacitor C, a sensitivity and an inertia of the current limiting control circuit 10 can be adjusted.

The current limiting control circuit 10 according to the invention and the superordinate circuit arrangement 5 according to the invention offer the advantage, among other things, that no external power supplies need be provided for the implementation of the current limiting function, because they form a passive circuit.

The invention claimed is:

1. A circuit arrangement (5) for current limiting, the circuit arrangement comprising:
    a first inductor (L1),
    a second inductor (L2),
    a current limiting control circuit (10),
    a resistor (R),
    a capacitor (C),
    a semiconductor switch (20),
    a gate driver (25), and
    a gate resistor (RG),
wherein
    an output terminal (12) of the current limiting control circuit (10) is connected to a control input (22) of the semiconductor switch (20) via the resistor (R),
    the gate driver (25) is connected via the gate resistor (RG) to the control input (22) of the semiconductor switch (20) and to the limiting resistor (RB) and is configured so as to control the semiconductor switch (20) to open and close,
    the current limiting control circuit (10) is configured so as to change an output impedance of the current limiting control circuit (10) at the output terminal (12) in order to control the semiconductor switch (20),
    a source terminal of the semiconductor switch (20) is connected to a reference potential (GND) of the circuit arrangement (5), and wherein the semiconductor switch (20) is configured so as to set a current (I) in a circuit between an electrical power source (30) and a load (40) as a function of a control by the current limiting control circuit (10),
    the first inductor (L1) and the second inductor (L2) are connected in series within the circuit,
    a first input terminal (14) of the current limiting control circuit (10) is connected via the capacitor (C) to a node between the first inductor (L1) and the second inductor (L2),
    a second input terminal (16) of the current limiting control circuit (10) is connected to the reference potential (GND), and
    the current limiting control circuit (10) is configured so as to detect an overcurrent-related reloading of the capacitator (C) and in response reduce its output impedance in order to thus increase an output impedance of the semiconductor switch (20) on the basis of a voltage drop across the resistor (R), so that the increased output impedance in the semiconductor switch (20) counteracts the overcurrent.

2. The circuit arrangement (5) according to claim 1, wherein
    the semiconductor switch (20) is at least one selected from the group consisting of:
        a power semiconductor switch,
        a MOSFET, an IGBT or a JFET,
        a Si, a SiC or a GaN-based semiconductor switch (20), and
        a topological semiconductor switch (20) formed of a plurality of parallel-connected individual semiconductor switches.

3. The circuit arrangement (5) according to claim 1, wherein the first inductor (L1) and/or the second inductor (L2) are respectively at least one selected from the group consisting of:
    a parasitic inductor,
    a discrete component,
    a coil,
    a shunt element;
    a drain source channel,
    a line section of the circuit,
    a busbar,
    a conductor track of a printed circuit board, and
    a transformer.

4. The circuit arrangement (5) according to claim 1, wherein the circuit arrangement (5) is configured so as to
    permanently maintain the increased output impedance of the semiconductor switch (20), or
    return the increased output impedance to an original value prior to the occurrence of the overcurrent after a predefined period of time.

5. The circuit arrangement (5) according to claim 1, wherein the circuit arrangement (5) is configured so as to completely inhibit a current flow (I) through the semiconductor switch (10) when an overcurrent-related reloading of the capacitor (C) is detected.

6. The circuit arrangement (5) according to claim 1, wherein
    the resistor (R) is a Zener diode, and/or
    the current limiting control circuit (10) is configured on the basis of a bipolar transistor (60) and/or on the basis of a MOSFET so as to adjust the output impedance thereof in the event of an overcurrent.

7. The circuit arrangement (5) according to claim 1, wherein the circuit arrangement (5)
    comprises a decharging resistor (RD1) connected to a first terminal having a base terminal of the bipolar transistor (60) and connected to a second terminal having a node between the resistor (R) and the control input (22) of the semiconductor switch (20), and/or
    a damping resistor (RD2) connected between the capacitator (C) and the first input terminal (14).

8. The circuit arrangement (5) according to claim 1, wherein the capacitor (C) is a parasitic capacitor.

9. The circuit arrangement (5) according to claim 1, wherein
    the electrical power source (30) is a drive battery for an electrically driven vehicle, and/or
    the load (40) is an inverter for a drive train of a vehicle, and/or the load (40) is connected in parallel with an intermediate circuit capacitor.

10. An electrical system comprising
a circuit arrangement (5) according to claim 1,
an electrical power source (30),
a load (40), and
a vehicle electrical system (80) for a vehicle,
wherein
the vehicle electrical system (80) is configured so as to transmit electrical power from the electrical power source (30) to the load (40), and
the circuit arrangement (5) is configured so as to reduce a current (I) between the load (40) and the electrical power source (30) by means of a control of the semiconductor switch (20) if a current (I) flowing through the vehicle electrical system (80) corresponds to an overcurrent.

* * * * *